United States Patent [19]

Hirt

[11] 4,331,505

[45] May 25, 1982

[54] METHOD FOR MANUFACTURING AN ELECTRON BEAM EMISSION APERTURE

[75] Inventor: Alfred Hirt, Munich, Fed. Rep. of Germany

[73] Assignee: Man Maschinenfabrik Augsburg-Nurnburg A.G., Munich, Fed. Rep. of Germany

[21] Appl. No.: 268,948

[22] Filed: Jun. 1, 1981

[30] Foreign Application Priority Data

Jun. 2, 1980 [DE] Fed. Rep. of Germany ....... 3020809

[51] Int. Cl.$^3$ .............................................. B05D 3/06
[52] U.S. Cl. .................................... 156/643; 156/644; 156/659.1; 427/43.1; 430/5; 430/296; 430/313; 430/319
[58] Field of Search ...................... 156/643, 644, 659.1; 430/5, 296, 396, 313, 319, 320; 250/396 R; 427/43.1

[56] References Cited

U.S. PATENT DOCUMENTS

| | | | |
|---|---|---|---|
| 3,971,860 | 7/1976 | Broers et al. ........................ | 430/296 |
| 3,996,468 | 12/1976 | Fletcher .......................... | 250/396 R |
| 4,119,688 | 10/1978 | Hiraoka ............................. | 427/43.1 |
| 4,293,374 | 10/1981 | Chaudhari et al. ................. | 430/296 |

OTHER PUBLICATIONS

Krakow et al. "Microgrids . . . Microscopy" IBM Technical Disclosure Bull., vol. 23, No. 5 (10/80) p. 2140.
Bowden et al. "Electron . . . Lithography" CRC Critical Reviews in Solid State Sciences Feb. 1979, pp. 224-264.

*Primary Examiner*—Jerome W. Massie
*Attorney, Agent, or Firm*—Alan H. Levine

[57] ABSTRACT

A method of manufacturing an electron emission aperture of an electron beam generator using the associated electron beam generator and the cathode of the generator which emits electrons at a plurality of points, as well as aperture lenses, and employing electron projection lithography. The associated electron beams are used to burn the emission spot pattern of the associated cathode into an electron-sensitive layer of a blank of a perforated mask, through holes in the mask are produced by etching at the burn spots, individual aperture spots corresponding to the emission spot pattern are burned into an electron-sensitive layer of a blank of the aperture through the through holes using the perforated mask and the associated electron beams, and the blind holes near the spots are etched allowing their individual apertures and a supporting grid to remain.

2 Claims, 2 Drawing Figures

U.S. Patent    May 25, 1982    4,331,505
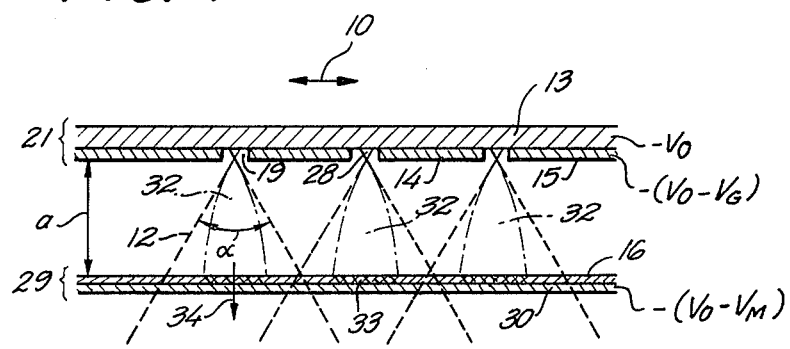
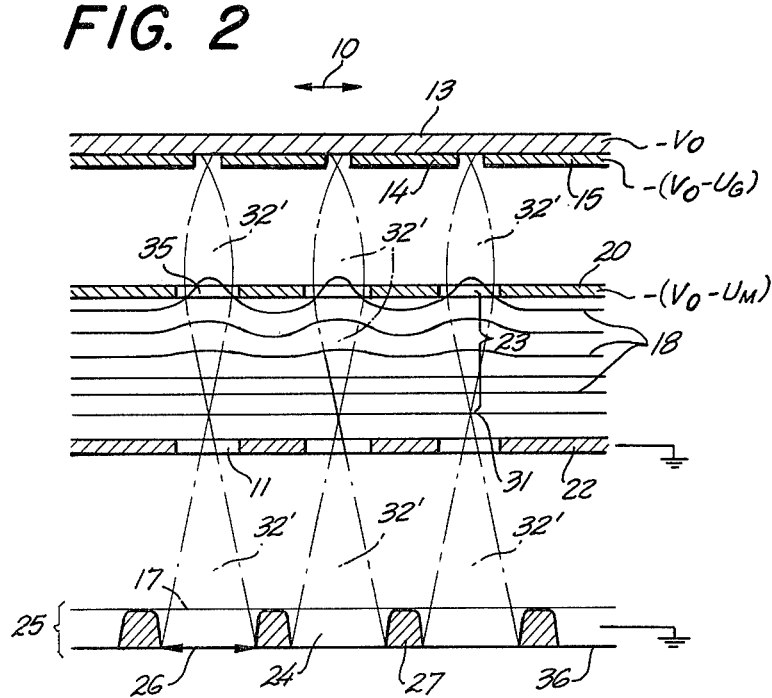

METHOD FOR MANUFACTURING AN ELECTRON BEAM EMISSION APERTURE

This invention relates to a method of manufacturing an electron emission aperture of an electron beam generator.

The problem surrounding such an aperture is that the aperture should be as thin as possible in the interest of maximum permeability of electrons, while at the same time it should be as thick as possible, for maximum strength. Another consideration is that the deceleration or absorption of the electrons, caused by the aperture as a result of inelastic scatter, rises with the atomic number of the aperture material in the periodic system of elements; thus for optimally suitable apertures, materials are selected that are difficult to machine, such as carbon or silicon. An optimally suitable aperture is intended to mean one that is as thin as possible, and that the electron beams generated should be exploited ideally, or to maximum benefit, means that as many electrons as possible should pass through the aperture.

Concerning the mechanical load the aperture should safely sustain, it should be able to absorb the 1-bar pressure difference between the atmosphere surrounding the electron beam generator and the negative pressure prevailing in the electron beam generator. The tensile strength of the aperture material nevertheless defines an upper limit to the area that can be bridged at a given thickness of aperture. In accordance with Ardenne, $$(x/D) \approx 5 \times 10^{-3} (p/Z),$$

where "$\approx$" is "approximately equal to", x=the thickness of aperture (for circular apertures) D is the diameter of the aperture, p=the pressure difference in bars, and Z=the tensile strength of the aperture material in $kp/mm^2$, while x/D=nondimensional.

It should be noted that electron absorption causes the aperture material to pick up heat, so that the tensile strength at a value corresponding to the higher temperature should be used in the equation. Taking aluminum as an example, it will be seen that Z is 9 at 20° C. and drops to 0.7 at 500° C.

The above formula indicates that the order of magnitude of the diameter of the aperture should be about $10^3$ times the thickness of aperture. This inevitably calls for struts to support thin foils, with the attendant disadvantages of absorption by the struts leading to high heat pickup and X-ray radiation.

It is a broad object of the present invention to largely eliminate these disadvantages while minimizing the effort expended to manufacture the aperture.

It is a particular object of the present invention to provide a method of making an aperture using electron projection lithography and employing an electron beam generator and spotemission cathode together with aperture lenses. The aperture lenses may optionally be referred to as window lenses or perforated lenses.

While IEEE TRANSACTIONS ON ELECTRON DEVICES, July 1975, pp. 400 to 409, Copyright 1975 by the Institute of Electrical and Electronics Engineers, Inc., Printed in the U.S.A. Annals No. 507ED005, discloses a method for producing an electron image via aperture lenses through electron projection lithography, this does not involve the manufacture of an electron emission aperture nor of its associated electron beam generator by means of its cathode, which is a spot-emission cathode. Based on the present invention, use can be made of the original electron beam generator or of the original spot-emission or spot-pattern cathode, or of the associated spot-emission to produce the emission pattern electronoptically with little manufacturing effort. There is an absence of adjusting problems, the aperture is manufactured such that when in service, it is largely permeable and can be penetrated at exactly defined points as presented by the pattern and with very little absorption. The aperture can be provided with a supporting grid or supporting grid struts or webs at exactly the points that are not impinged upon by electrons, which are points between the permeable points or individual apertures. In service, therefore, the supporting grid comes under practically no electron load and can therefore be optimized. It is also possible to produce an optimized aperture admitting of electronoptical distortion, e.g., an irregular pattern as perhaps elliptic rather than round holes produced by electronoptical distortion. The present invention permits the aperture to be optimized with a view to the associated electron beam generating system, and for the manufacture of the aperture, use is made of the associated electron beam generator rather than of some other device.

Based on the present invention, electron projection lithography also permits very small diameters for individual apertures or for the thin, unsupported sheet. There are no restrictions regarding the selection of material for this aperture sheet. It will also be possible to use an aperture sheet material other than the material used for the supporting grid. For example, a thin layer of graphite, which is adequately permeable to electron beams, can be deposited on a ceramic material, with the application of heat, and the use of the present invention will then enable individual thin, graphite sheet apertures and a ceramic supporting grid to be produced. The supporting grid can optionally be made of silicon, however, and the individual apertures can also be made of silicon.

The associated cathode can alternatively be a point cathode (wire with thin, V-shaped cross members) or a brush cathode (wire with thin cross bristle). According to a special feature of the present invention, however, it is a thin-film field emission cathode having many or numerous electron-emitting cones (individual cathodes), for which see JOURNAL OF APPLIED PHYSICS, Vol. 47, No. 12, December 1976, pp. 5248 to 5263, Copyright 1976, American Institute of Physics, USA. Such a cathode provides, owing to the stability of emission (e.g. no thermal run-off of emission peaks), ideal conditions for optimizing the aperture.

The associated cathode preferably has the emission points arranged in parallel lines. The point cathode then consists of parallel wires each having thin, V-shaped cross members.

The electron beam generator generally serves for the hardening (electron beam hardening) of a surface or a surface layer, especially a viscous, preferably printed surface layer, e.g., a color coating. The surface layer, more particularly, is deposited on a paper web.

The uniformity of radiation desired in the hardening process can be simulated by the hole pattern, especially when starting with a cathode on which the emission points of mutually parallel rows of points are staggered, through holes and blind holes of mutually parallel rows of holes are produced in staggered arrangement. However, dispersion in the air may flare the beam sufficiently to obscure the structure of the aperture and so eliminate the need for such simulation.

The drawings schematically illustrate an emobidment of the method of this invention. In the drawings:

FIG. 1 illustrates the manufacture of a perforated mask; and

FIG. 2 illustrates the manufacture of the aperture using the same associated electron beam generator and, thus, with the cathode of that electron beam generator.

The elements shown in FIGS. 1 and 2, are the associated cathode 21, a blank 29 of a perforated mask 20, the perforated mask 20, a perforated mask 22, and the aperture 25. These elements are oblong, flat, thin plates which longitudinally extend in the direction of the double headed arrow 10 and which transversely extend perpendicularly to the plane of projection. They extend in horizontal planes in a parallel arrangement one above the other, and are shown in schematic and interrupted (broken-away) arrangement. FIGS. 1 and 2 are elevational views of the items concerned.

The associated cathode 21 of FIGS. 1 and 2 is a thin-film field emission cathode about 1500 mm long and 30 mm wide arranged (although this is not shown on the drawing) in the vacuum interior of the associated cylindrical, horizontally arranged electron beam generator tube or the housing thereof, where it extends parallel to the longitudinal centerline of the tube or housing. It is apertures 25 of this tube and its cathode 21 that it is intended to produce. Their electron beams are used for electron beam hardening. In accordance with FIGS. 1 and 2, although this is illustrated only in FIG. 2, an aperture 25 is arranged in the wall of the housing at a distance of about 150 mm below the cathode 21 in the form of, originally, a blank (without the blind holes 24). The cathode essentially consists of a ceramic backing, which is omitted in the drawing, and attached to its underside are a row of strips consisting of a silicon layer 13 (electrode) about 1 mm thick, a silicon dioxide layer 14 about 2 $\mu$m thick, and a molybdenum film 15 (electrode) about 0.5 $\mu$m thick, these three layers succeeding one another downwardly in that order together with a plurality of identical cones 28 (individual cathodes) made of molybdenum. Each cone 28 is arranged in a round cavity 19 in the layer 14, its base located at the layer 13 and its points in a round opening in the film 15. The cones 28 are arranged successively in the direction of the double headed arrow 10 and parallel therewith, i.e., in several parallel rows.

With reference to FIG. 1, a blank 29 of the perforated mask 20 is arranged at a distance of about 50 mm below the associated cathode 21. It consists of a main body 30 (anode) and a thin, electron-sensitive layer (or photolayer) 16. The thickness of the layer 16, when compared with the thickness of the main body 30 as seen in FIG. 1, is shown much smaller.

$V_0$ (0 zero) indicates the voltage at the first electrode 13, while $V_0-V_G$ (G=grid) indicates the voltage difference between electrode 13 and the second electrode 15 and $(V_0-V_M)$ (M=mask, $V_M$=post accelerating voltage) indicates the voltage difference between the first electrode 13 and the third electrode 30. This applies analogously to FIG. 2.

The associated electrode 21 emits electrons at specific points, which are the cones 28 or the points thereof, the emission spot of each point having a diameter of about 50 nm (=50 nanometer=$10^9$m=0.001$\mu$). In the absence of post-acceleration, the emission angle of the emission cone 12, shown in dashed lines, would be about 60°. Post-acceleration, however, narrows the emission cone or angle, as indicated by the sugar-loaf shaped electron beams 32 shown in dot-dash lines.

The associated electron beams 32, forming as they do an electron beam curtain, each burn a round spot 33 (cross-hatched) into the layer 16 (irradiate, expose) which is much larger than the emission spot. Thus, in the layer 26, an image of the associated cathode 21 is formed which includes equally as many spots and parallel rows of spots as has the cathode 21, except that the spots are considerably magnified (a wider distance "a" still enlarges the spots 33). At these burnt holes 33 the blank 29 is etched using conventional etching techniques (see arrow 34) to produce through-holes 35 or, upon removal of the unexposed portions of the layer 16, the perforated (individual lens) mask 20. The diameter of the through-hole 35 approximately equals that of the burnt spot 33.

With reference to FIG. 2, the aperture blank carries on its underside, a layer 36 made of aperture material, which is about 2$\mu$ thick and which is permeable to electrons. Arranged in the associated tube or housing thereof, in the space between the cathode 21 and the aperture blank, are electron optics consisting of perforated masks 20 and 22. The perforated mask 20 is about 50 mm below the cathode 21, and the perforated mask 22 is about 50 mm below the perforated mask 20 such that the cones 28, the through-holes 35 of the perforated mask 20, and the through-holes 11 of the perforated mask 22 are aligned vertically. The perforated mask 22 is manufactured, as is the perforated mask 20, in the manner shown with reference to FIG. 1, with and inside the associated tube and with the associated cathode 21. The diameters of the through-holes 11 and of the through-holes 35 are about the same size.

The perforated mask 20 illustrated in FIG. 2 is an electrode on voltage difference-$(V_0-V_M)$. Further electrodes seen in FIG. 2 are the layer 13, the film 15, and the perforated mask (anode) 22. The perforated mask 22 and the aperture blank are grounded. In FIG. 2, use is again made of post-acceleration. The electron beam 32' from the cones 28 (electron curtain) penetrate the through-holes 35 and 11, where each through-hole 35 acts as an individual lens to focus the electron beam 32'. The electron beams 32' impinge upon an electron-sensitive layer 17, not shown in the drawing, of the aperture blank, into which they burn an image of the associated cathode 21 with considerably enlarged individual aperture spots, as was the case in the manufacture of the perforated masks. The perforated mask 22 serves the function of creating a field-free space between itself and the aperture blank so that the layer 17 need not act as an electrode, i.e., not be electrical, for the material of the layer 17 is not normally electrically conductive.

The focal distance of the individual lens (through-hole 35) is indicated by the numeral 23, and the associated focus by the numeral 31. Equipotential lines between the perforated masks 20 and 22 are indicated by the numeral 18. A change in voltage difference - $(V_0-V_M)$ will vary the focal distance 23 and thus produce a change in the image, or in the size of the individual aperture spots.

Finally, blind holes 24 are etched into the aperture blank at the individual aperture spots as far as the layer 36, so that thin films will remain as individual apertures 26, plus a supporting grid 27 consisting of webs or struts around the blind holes 24.

The place of the parallel rows of through-holes 11 can be taken by continuous longitudinal slots of a width at least equal to the diameter of the beam 32' at that point.

The etching of the through or blind holes can be achieved outside the housing of the electron beam generator or the electron beam generator tube, or with the surface being suitably masked in the interior of the housing by means of removable coatings, inside the housing, especially by filling the housing with a liquid etchant. The liquid etchant will invariably be such that, whether used outside or inside the housing, it will be active, or etch, only at the spots and not in areas adjacent to them.

The invention has been shown and described in preferred form only, and by way of example, and many variations may be made in the invention which will still be comprised within its spirit. It is understood, therefore, that the invention is not limited to any specific form or embodiment except insofar as such limitations are included in the appended claims.

I claim:

1. A method of manufacturing an electron emission aperture of an electron beam generator, the generator having a cathode for emitting electrons at a plurality of points, characterized by the aperture being produced using the associated electron beam generator and the associated spot-emission cathode in combination with perforated masks for electron exposure during electron projection lithography.

2. A method as defined in claim 1 including the steps of using associated electron beams to burn the emission spot pattern of the associated cathode into an electron-sensitive layer on a blank of a perforated mask, producing through-holes in the perforated mask by etching at the burn spots, burning individual aperture spots corresponding to the emission spot pattern into an electron-sensitive layer on a blank of aperture material through said through-holes of the perforated mask utilizing the associated electron beams, and etching blind holes at said spots allowing the thin film of the individual apertures and a supporting grid to remain.

* * * * *